United States Patent
Robins et al.

(10) Patent No.: US 6,727,528 B1
(45) Date of Patent: Apr. 27, 2004

(54) THYRISTOR-BASED DEVICE INCLUDING TRENCH DIELECTRIC ISOLATION FOR THYRISTOR-BODY REGIONS

(75) Inventors: Scott Robins, San Jose, CA (US); Andrew Horch, Mountain View, CA (US); Farid Nemati, Menlo Park, CA (US); Hyun-Jin Cho, Palo Alto, CA (US)

(73) Assignee: T-RAM, Inc., San Jose, CA (US)

( * ) Notice: Subject to any disclaimer, the term of this patent is extended or adjusted under 35 U.S.C. 154(b) by 210 days.

(21) Appl. No.: 09/815,213

(22) Filed: Mar. 22, 2001

(51) Int. Cl.[7] ............................................... H01L 29/74
(52) U.S. Cl. ...................................... 257/133; 257/147
(58) Field of Search ................................... 257/133, 141, 257/142, 147, 155, 162, 124, 200, 329, 330, 344, 347, 139, 136, 135, 137, 148, 149, 150, 151, 153, 167, 903, 138

(56) References Cited

U.S. PATENT DOCUMENTS

| | | |
|---|---|---|
| 3,918,033 A | 11/1975 | Case et al. |
| 3,943,549 A | 3/1976 | Jaecklin et al. |
| 3,986,177 A | 10/1976 | Picquendar et al. |
| 4,031,412 A | 6/1977 | Ohhinata et al. |
| 4,032,955 A | 6/1977 | Anthony et al. |
| 4,090,254 A | 5/1978 | Ho et al. |
| 4,103,415 A | 8/1978 | Hayes |
| 4,146,902 A | 3/1979 | Tanimoto et al. |
| 4,165,517 A | 8/1979 | Temple et al. |
| 4,281,336 A | 7/1981 | Sommer et al. |
| 4,323,793 A | 4/1982 | Schutten et al. |
| 4,353,086 A | 10/1982 | Jaccodine et al. |
| 4,590,589 A | 5/1986 | Gerzberg |
| 4,593,459 A | 6/1986 | Poppert et al. |
| 4,612,448 A | 9/1986 | Strack |
| 4,641,166 A | 2/1987 | Takemae et al. |

(List continued on next page.)

FOREIGN PATENT DOCUMENTS

| | | |
|---|---|---|
| FR | 2110326 | 6/1972 |
| JP | 57 208177 | 12/1982 |

OTHER PUBLICATIONS

Jun. 1998, Nemati,Farid, and Plummer, James D., "A Novel High Density, Low Voltage SRAM Cell with a Vertical NDR Device", VLSI Technology Technical Digest.

1999, Nemati, Farid, and Plummer James, D., "A Novel Thyristor–based SRAM Cell (T–RAM) for High–Speed, Low–Voltage, Giga–scale Memories", International Electron Device Meeting Technical Digest.

(List continued on next page.)

*Primary Examiner*—Minhloan Tran
*Assistant Examiner*—Kevin Quinto

(57) ABSTRACT

A semiconductor device includes a thyristor designed to reduce or eliminate manufacturing and operational difficulties commonly experienced in the formation and operation of NDR devices. According to one example embodiment of the present invention, the semiconductor substrate is trenched adjacent a doped or dopable substrate region, which is formed to include at least two vertically-adjacent thyristor regions of different polarity. A capacitively-coupled control port for the thyristor is coupled to at least one of the thyristor regions. The trench also includes a dielectric material for electrically insulating the vertically-adjacent thyristor regions. The thyristor is electrically connected to other circuitry in the device, such as a transistor, and used to form a device, such as a memory cell.

46 Claims, 16 Drawing Sheets

U.S. PATENT DOCUMENTS

| | | |
|---|---|---|
| 4,646,121 A | 2/1987 | Ogura |
| 4,672,410 A | 6/1987 | Miura et al. |
| 4,673,962 A | 6/1987 | Chatterjee et al. |
| 4,677,455 A | 6/1987 | Okajima |
| 4,734,384 A | 3/1988 | Tsuchiya |
| 4,797,373 A | 1/1989 | Malhi et al. |
| 4,829,357 A | 5/1989 | Kasahara |
| 4,833,516 A | 5/1989 | Hwang et al. |
| 4,864,168 A | 9/1989 | Kasahara et al. |
| 4,868,138 A | 9/1989 | Chan et al. |
| 4,959,703 A | 9/1990 | Ogura et al. |
| 4,982,258 A | 1/1991 | Baliga |
| 4,997,790 A | 3/1991 | Woo et al. |
| 5,034,785 A | 7/1991 | Blanchard |
| 5,081,518 A | 1/1992 | El-Diwany et al. |
| 5,082,796 A | 1/1992 | El-Diwany et al. |
| 5,099,300 A | 3/1992 | Baliga |
| 5,106,776 A | 4/1992 | Shen et al. |
| 5,252,845 A | 10/1993 | Kim et al. |
| 5,307,310 A | 4/1994 | Narita |
| 5,321,285 A | 6/1994 | Lee et al. |
| 5,321,289 A | 6/1994 | Baba et al. |
| 5,324,966 A | 6/1994 | Muraoka et al. |
| 5,334,548 A | 8/1994 | Shen et al. |
| 5,390,145 A | 2/1995 | Nakasha et al. |
| 5,396,454 A | 3/1995 | Nowak |
| 5,412,598 A | 5/1995 | Shulman |
| 5,422,296 A * | 6/1995 | Lage |
| 5,463,344 A | 10/1995 | Temple |
| 5,464,994 A | 11/1995 | Shinohe et al. |
| 5,471,419 A | 11/1995 | Sankaranarayanan et al. |
| 5,488,242 A | 1/1996 | Sunouchi et al. |
| 5,504,357 A | 4/1996 | Kim et al. |
| 5,525,820 A | 6/1996 | Furuyama |
| 5,528,062 A | 6/1996 | Hsieh et al. |
| 5,543,652 A | 8/1996 | Ikeda et al. |
| 5,587,944 A | 12/1996 | Shen et al. |
| 5,689,458 A | 11/1997 | Kuriyama |
| 5,874,751 A | 2/1999 | Iwamuro et al. |
| 5,910,738 A | 6/1999 | Shinohe et al. |
| 5,914,503 A | 6/1999 | Iwamuro et al. |
| 5,936,267 A | 8/1999 | Iwamuro |
| 5,939,736 A | 8/1999 | Takahashi |
| 5,981,984 A | 11/1999 | Iwaana et al. |
| 6,081,002 A * | 6/2000 | Amerasekera et al. |
| 6,218,217 B1 | 4/2001 | Uenishi et al. |
| 6,225,165 B1 * | 5/2001 | Noble, Jr. et al. |
| 6,229,161 B1 | 5/2001 | Nemati et al. |
| 6,391,689 B1 | 5/2002 | Chen |
| 6,448,586 B1 | 9/2002 | Nemati et al. |
| 6,462,359 B1 | 10/2002 | Nemati et al. |
| 6,551,868 B1 * | 4/2003 | Auriel et al. |
| 2001/0024841 A1 | 9/2001 | Noble, Jr. et al. |
| 2002/0093030 A1 | 7/2002 | Hsu et al. |
| 2002/0096690 A1 | 7/2002 | Nemati et al. |
| 2002/0100918 A1 | 8/2002 | Hsu et al. |

OTHER PUBLICATIONS

Jun. 1998, F.Nemati and J.D. Plummer. *A Novel High Density, Low Voltage SRAM Cell with a Vertical NDR Device*, Center for Integrated Systems, Stanford University, Stanford, CA 94305.

F.Nematl and J.D. Plummer, *A Novel Vertical Storage SRAM Cell*, Student Paper written for Center for Integrated Systems, Stanford University, Stanford, CA 94305.

1999, F. Nemati and J.D. Plummer, *A Novel Thyristor–based SRAM Cell (T–RAM) for High–Speed, Low–Voltage, Giga–scale Memories*, Center for Integrated Systems, Stanford University, Stanford, CA, 1999.

1987, Baliga, B.Jayant, *Modern Power Devices*, pp. 349–350.

Feb. 1980, Plummer, James D. and Scharf, Brad W., *Insulated–Gate Planar Thyristors: I–Structure and Basic Operation*, pp. 380–386.

Aug. 1992, Christopher J. Petti, and James D. Plummer, *The Field–Assisted Turn–Off Thyristor: A Regenerative Device with Voltage–Controlled Turn–Off*.

1981, S. M. Szg, *Physics of Semiconductor Devices Second Edition*. John Wiley & Sons, pp. 198–209, 1981.

1998, Gribnikov, Z.S., Korobov, V.A. and Mltin, V.V., "The Tunnel Diode As A Thyristor Emitter", Solid–State Electronics. vol. 42, No. 9, pp. 1761–1763.

* cited by examiner

THYRISTOR-BASED DEVICE INCLUDING TRENCH DIELECTRIC ISOLATION FOR THYRISTOR-BODY REGIONS

FIELD OF THE INVENTION

The present invention is directed to semiconductor devices and, more specifically, to semiconductor devices including thyristor-based devices.

BACKGROUND

The semiconductor industry has recently experienced technological advances that have permitted dramatic increases in integrated circuit density and complexity, and equally dramatic decreases in power consumption and package sizes. Present semiconductor technology now permits single-die microprocessors with many millions of transistors, operating at speeds of hundreds of millions of instructions per second to be packaged in relatively small, air-cooled semiconductor device packages. The improvements in such devices has led to a dramatic increase in their use in a variety of applications. As the use of these devices has become more prevalent, the demand for reliable and affordable semiconductor devices has increased. Accordingly, the need to manufacture such devices in an efficient and reliable manner has become increasingly important.

An important part in the circuit design, construction, and manufacture of semiconductor devices concerns circuitry such as semiconductor memories and other circuitry used to store digital information. Conventional random access memory devices include a variety of circuits, such as SRAM and DRAM circuits. The construction and formation of such memory circuitry typically involves forming at least one storage element and circuitry designed to access the stored information.

There are a number of semiconductor memories in wide spread use. Two such semiconductor memories are SRAM and DRAM. DRAM is very common due to its high density (e.g., high density has benefits including low price). DRAM cell size is typically between 6 and 8 $F^2$, where F is the minimum feature size. However, DRAM is relatively slow compared to microprocessor speeds (typical DRAM access times are ~50 nSec) and requires refresh. SRAM is another common semiconductor memory. SRAM is much faster than DRAM (SRAM access times can be less than or equal to about 5 nSec) and do not require refresh. SRAM cells are typically made using 4 transistors and 2 resistors or 6 transistors, which results in much lower density and is typically about 60–100 $F^2$.

A novel type of NDR-based SRAM has been recently introduced that can potentially provide the speed of conventional SRAM at the density of DRAM in a CMOS compatible process. This new SRAM cell uses a thin capacitively-coupled NDR device and more specifically a thin capacitively-coupled thyristor to form a bistable element for the SRAM cell. For more information about this type of NDR device, reference may be made to: "A Novel Thigh Density, Low Voltage SRAM Cell With A Vertical NDR Device," VLSI Technology Technical Digest, June, 1998; "A Novel Thyristor-based SRAM Cell (T-RAM) for High-Speed, Low-Voltage, Giga-Scale Memories," International Electron Device Meeting Technical Digest 1999, and "A Semiconductor Capacitively-Coupled NDR Device And Its Applications For High-Speed High-Density Memories And Power Switches," PCT Int'l Publication No. WO 99/63598, corresponding to U.S. patent application Ser. No. 09/092,449, now U.S. Pat. No. 6,229,161 issued May 18, 2001.

While the thin-capacitively-coupled-thyristor type device is effective in overcoming many previously unresolved problems for memory applications, an important consideration is designing the body of the thyristor sufficiently thin so that the capacitive coupling between the control port and the underlying thyristor base region can substantially modulate the potential of this base region and result in an outflow of this base region's minority carriers (versus MOSFET operation where channel inversion results from an inflow of minority carriers).

The above-mentioned and other difficulties associated with the formation of vertical thyristor-based devices present challenges to the manufacture and implementation of such devices.

SUMMARY

The present invention is directed to overcoming the above-mentioned challenges and others related to thyristor-based memory devices, such as the devices discussed above. The present invention is exemplified in a number of implementations and applications, some of which are summarized below.

One aspect of the present invention is directed to a semiconductor device including a thyristor designed to reduce or eliminate manufacturing and operational difficulties commonly experienced in the formation and operation of NDR devices. According to one example embodiment, the semiconductor substrate is trenched adjacent a doped or dopable substrate region, which is formed to included at least two vertically-adjacent thyristor regions of different polarity. A capacitively-coupled control port for the thyristor is coupled to at least one of the thyristor regions. The trench also includes a dielectric material for electrically insulating the vertically-adjacent thyristor regions.

In a more particular example embodiment of the present invention, the thyristor is a thin capacitively coupled thyristor as characterized previously. The thin-capacitively-coupled-thyristor-type device includes at least two contiguously adjacent portions of opposite doping and is electrically isolated from other circuitry in the device by the trench. A control port is capacitively coupled to one or more of the contiguously adjacent portions, and in one particular implementation, is formed in the trench. The control port can be further isolated from selected regions of the thyristor via an insulative material formed in the trench, and in one implementation the trench includes an oxide spacer at a bottom portion of the trench.

Other aspects of the present invention are directed to the location of the control port. In a more specific approach, the above example embodiment further involves forming the control port in the trench so that the control port is capacitively coupled to at least one of the vertically-adjacent regions. In one implementation, the control port is capacitively coupled to only one of the vertically-adjacent regions and is adapted to control the operation of the thyristor.

The above summary of the present invention is not intended to describe each illustrated embodiment or every implementation of the present invention. Other aspects include methods for using and for manufacturing such a thyristor and to memory arrangements employing the above-characterized thyristor construction. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1:
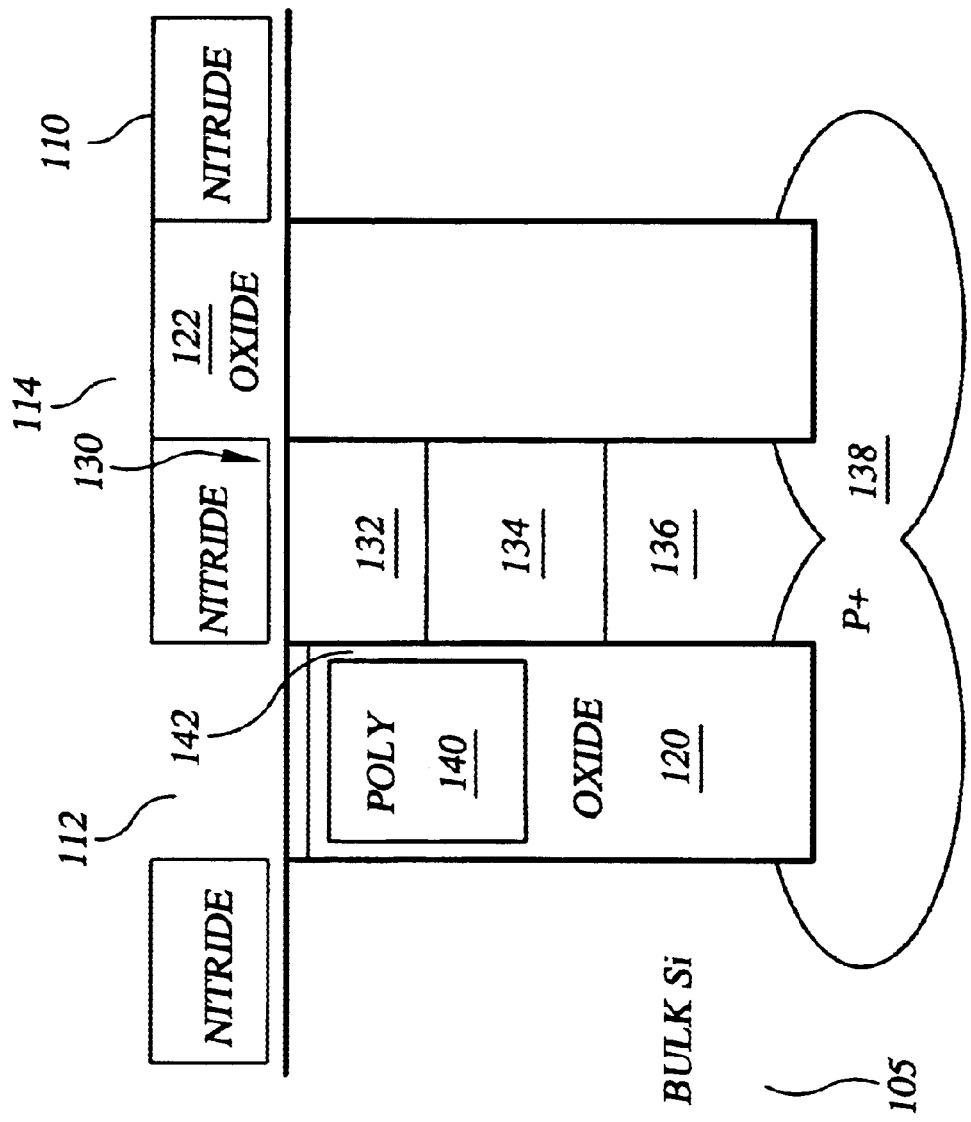
FIG. 1 is a thyristor-based semiconductor device, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for devices using thyristor-based devices, such as memory cells, and for enhancing the ability to form such devices in a semiconductor substrate. While the present invention is not necessarily limited to such devices, various aspects of the invention may be appreciated through a discussion of various examples using this context.

According to an example embodiment of the present invention, a thyristor-based semiconductor device, such as a memory cell, is manufactured in a manner that includes forming a trench in the device that electrically isolates a vertical thyristor. A trench is formed in the device using conventional methods, such as by patterning a mask over semiconductor substrate (e.g., bulk silicon) and subsequently etching the trench at a portion of the substrate that is exposed via the patterned mask. An electrically insulative material is formed in the trench, and a portion of the device adjacent the trench is implanted to form the body of a thyristor. In one particular implementation, the portions of the device implanted includes a portion surrounded by the trench. The body of the thyristor is formed having adjacent portions, at least one of which is disposed vertically adjacent another one of the contiguous regions. The thyristor can be formed in a variety of spatial orientations, can be implemented with conventional CMOS fabrication methods, and is particularly applicable as a thin capacitively coupled thyristor, as characterized previously. A control port, such as a gate, is capacitively coupled to one of the contiguous regions of the thyristor and adapted to control the operation of the thyristor, for example, by effecting the switching of the thyristor between a blocking state and a conducting state. A reference voltage is coupled to another one of the contiguous regions. In one particular implementation, the gate is formed in the trench, and in another implementation the gate is formed surrounding a contiguous portion of the thyristor. The isolation trench addresses challenges including those discussed in the background hereinabove, including the need to electrically isolate the thyristor from surrounding circuitry while maintaining the ability to manufacture devices near the thyristor.

In a more particular example embodiment of the present invention, the thyristor is formed as part of a memory cell that uses either an NMOSFET or a PMOSFET as an access transistor, or pass gate, to the thyristor. A source/drain region of the access transistor is electrically connected to an emitter region (e.g., anode or cathode) of the body of the thyristor. The pass gate may, for example, also include vertical portions as does the thyristor. The emitter region to which the pass transistor is connected may have a different doping type than the pass transistor source/drain region. In a more specific example embodiment of the present invention using a transistor as a pass gate, an isolation trench is formed adjacent the pass gate and a gate for the transistor is formed in the trench, such as using methods described herein to form a control port for the thyristor.

In another particular implementation, an insulative portion is formed in the trench and is configured and arranged to prevent the control port from coupling to more than one contiguous region of the thyristor. In this manner, it is possible to couple either a lower or upper contiguous region, or to independently couple two contiguous regions in opposite electrical directions using two control ports. In a more particular implementation, the insulative portion includes a spacer formed at the bottom of the trench prior to the formation of the control port in the trench for the thyristor.

The Figures show thyristor-based semiconductor devices being formed having adjacent trench isolation, according to various example embodiments of the present invention. Certain ones of the figures use reference numbers similar to numbers used in previously described figures, and not necessarily with repeated description thereof.

Beginning with FIG. 1, a nitride mask 110 is deposited over a semiconductor material 105 including bulk silicon, and a photo mask is patterned over the nitride mask. The nitride mask is etched in a manner that leaves at least two open portions 112 and 114 over the semiconductor material 105. The nitride mask is then removed at the open portions and exposing the semiconductor material thereunder. Trenches are etched in the semiconductor material at the exposed material, and an oxide liner may be formed in the trenches. The depth of the trench is selected to achieve electrical insulation from other circuitry in the device, and in one particular implementation is about 0.5 microns. In addition, the trenches can be formned having different depths, such as for use in an existing process without significantly changing the isolation of the existing logic when the existing trench isolation is too shallow for thyristor isolation.

After the trenches are etched, a region 138 of the substrate 105 at a lower end of a thyristor pillar 130 is implanted with a dopant to form an emitter region of the thyristor. Oxide material 120 and 122 is deposited in the trenches and planarized using a process such as chemical-mechanical polishing (CMP). The planarized oxide is then patterned with a photo mask and a portion of the oxide in the trench under open portion 112 is etched to form an open area for a poly gate for the thyristor. A gate dielectric 142 is formed in portion of the gate open area adjacent the thyristor pillar, and polysilicon gate material 140 is deposited in the gate open area. Additional oxide is then formed over the polysilicon gate, and the nitride is stripped off the device. Additional thyristor regions are then formed, including base regions 136 and 134 and emitter region 132, which are electrically insulated by the oxide 120 and 122.

Figure 2:
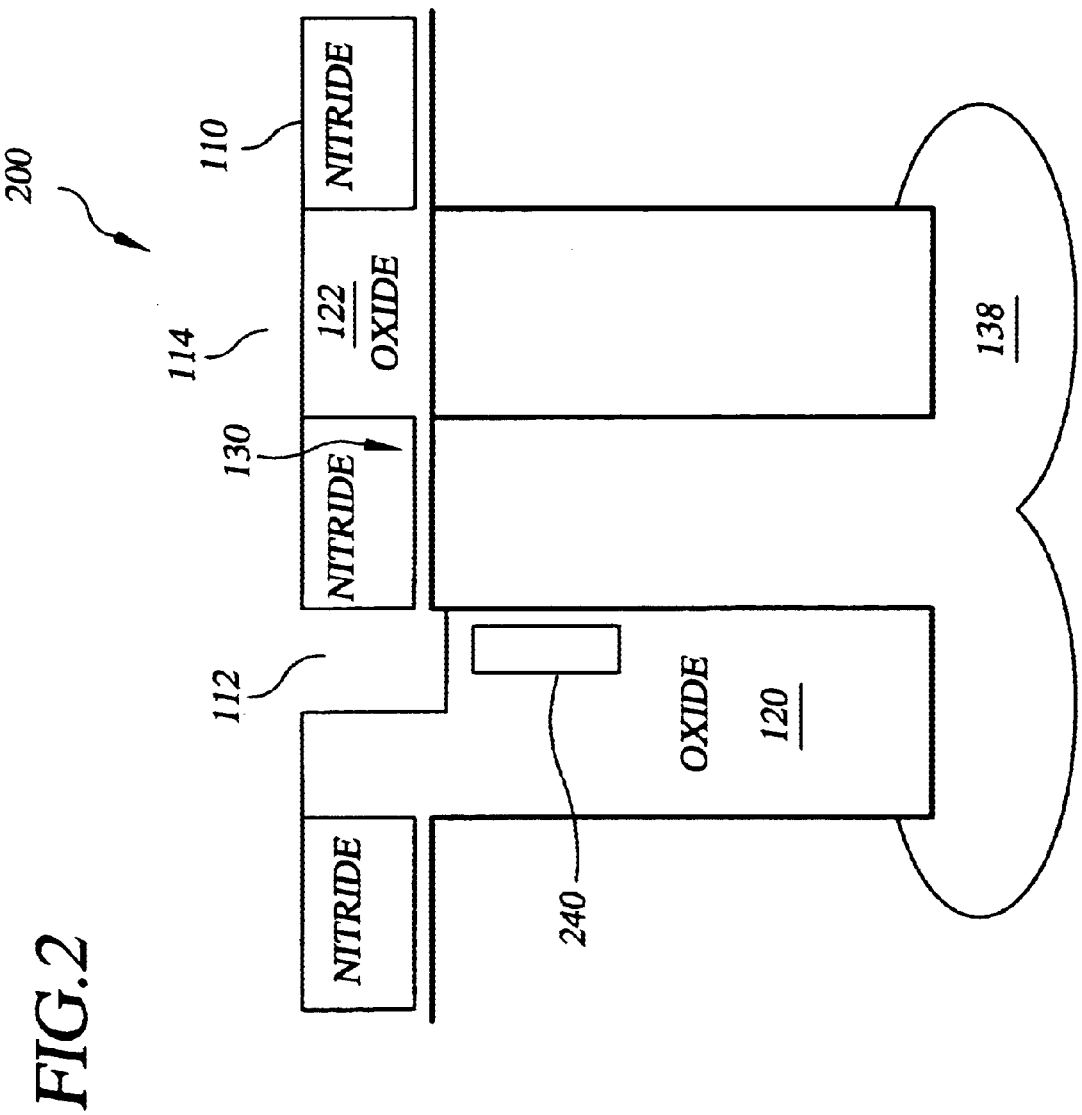
FIG. 2 is a thyristor-based semiconductor device, according to another example embodiment of the present invention.

FIG. 2 shows a semiconductor device 200 having a gate 240 formed in a portion of the trench 112, according to another example embodiment of the present invention. In this example, the gate is formed in an open area that is near one sidewall of the trench, the sidewall being adjacent a portion where a thyristor is to be formed. FIGS. 3–7 show a thyristor-based device being formed using similar steps.

Figure 3:
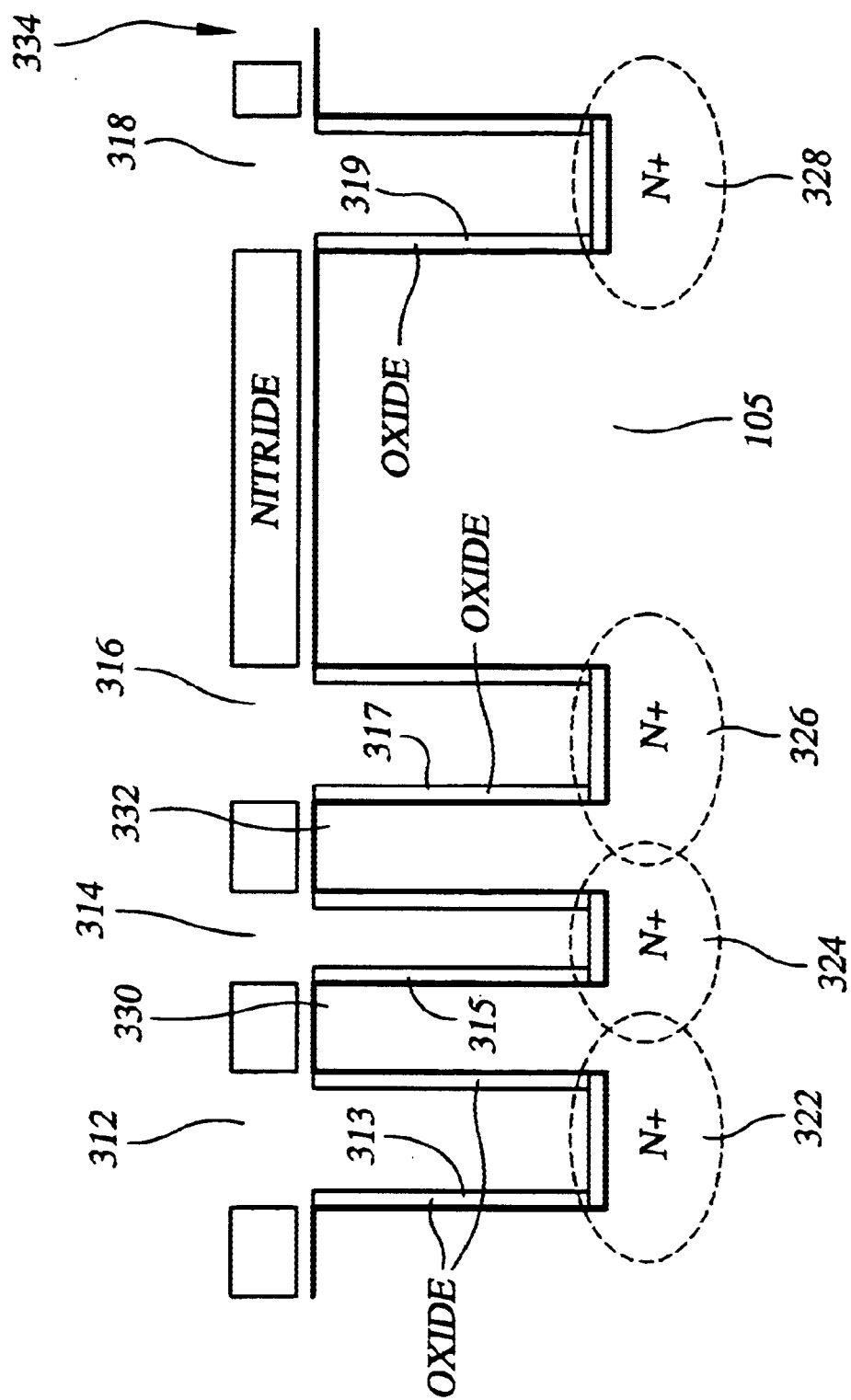
FIG. 3 shows a step in the formation of a thyristor-based semiconductor device, according to another example embodiment of the present invention.
Figure 4:
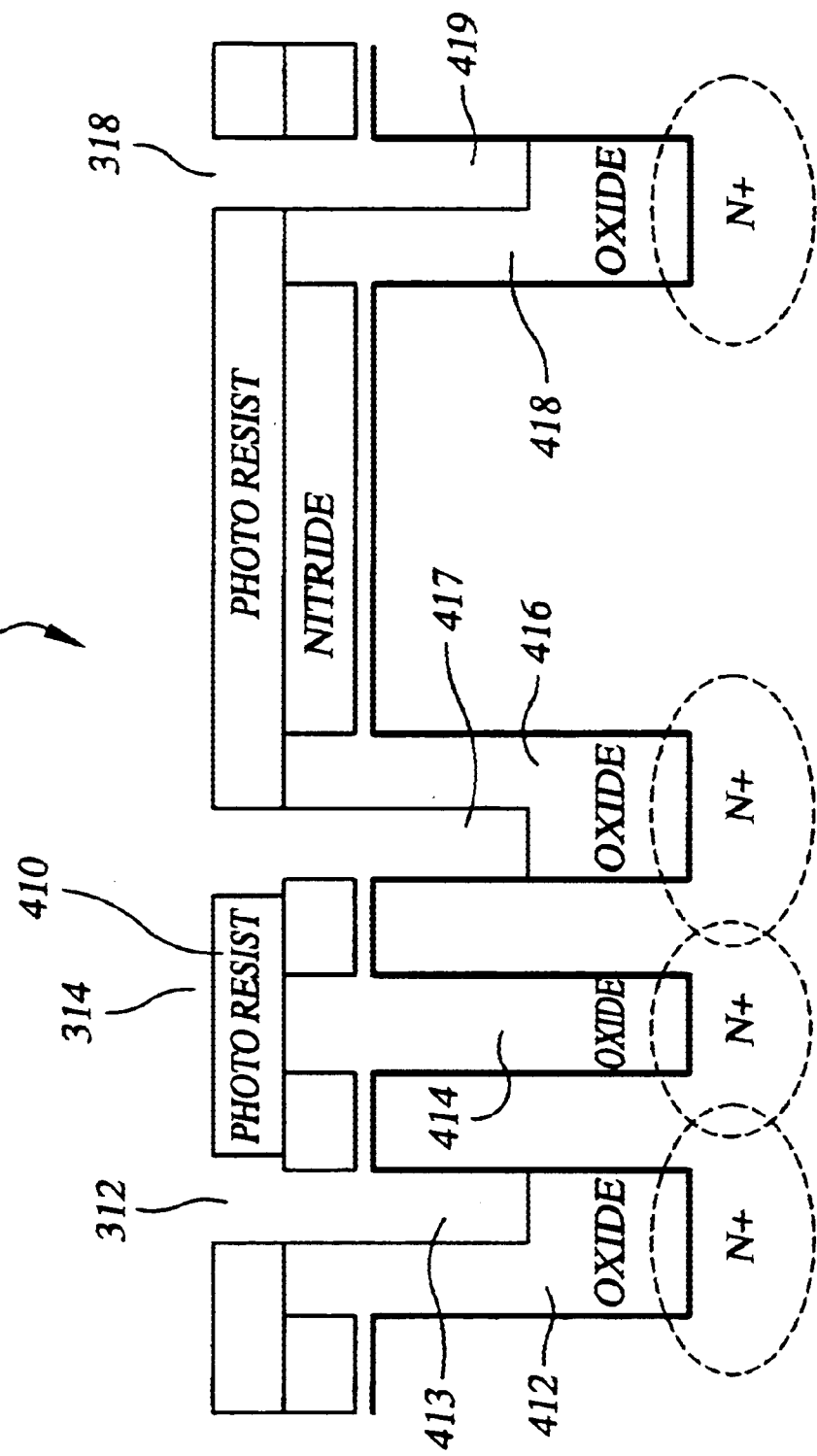
FIG. 4 shows another step in the formation of the thyristor-based semiconductor device shown in FIG. 3, according to another example embodiment of the present invention.
Figure 5:
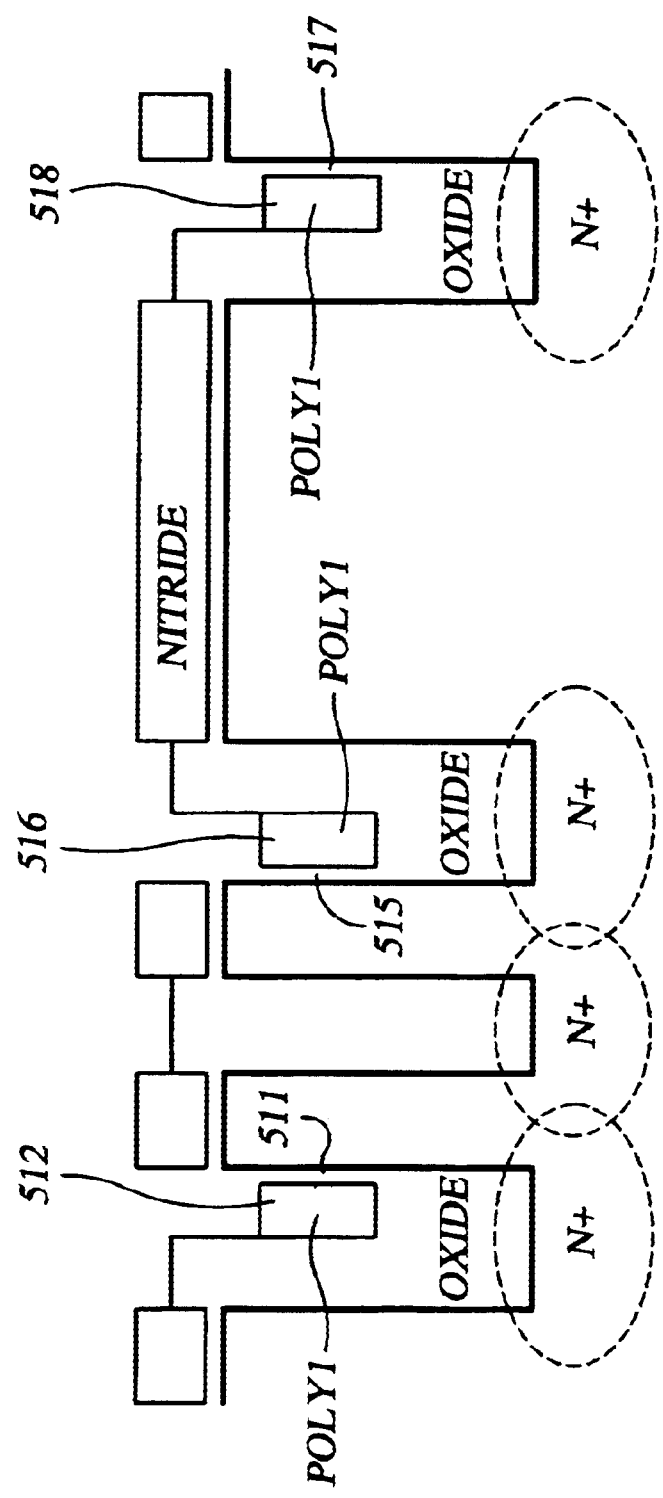
FIG. 5 shows another step in the formation of the thyristor-based semiconductor device shown in FIG. 4, according to another example embodiment of the present invention.

Beginning with FIG. 3, thyristor devices are formed at stacks 330, 332 and 334, according to a more particular example embodiment of the present invention. A nitride mask is used to form openings 312, 314, 316 and 318 in substrate 105 in the device, and oxide liners 313, 315, 317 and 319 are formed on sidewalls and bottoms of the openings. Dopant 322, 324, 326 and 328 is then implanted via the bottom of each of the openings to be used in forming an emitter region of subsequently formed thyristors. Oxide 412, 414, 416 and 418 is deposited in each opening and a photo resist 410 is then patterned over the device in FIG. 4. Openings 413, 417 and 419 are formed in the oxide. As shown in FIG. 5, gate oxides 511, 515 and 517 are formed on the sidewalls of the thyristor pillars 330, 332 and 334 and polysilicon gates 512, 516 and 518 are formed therein and electrically coupled to base regions of the adjacent thyristors.

Figure 6:
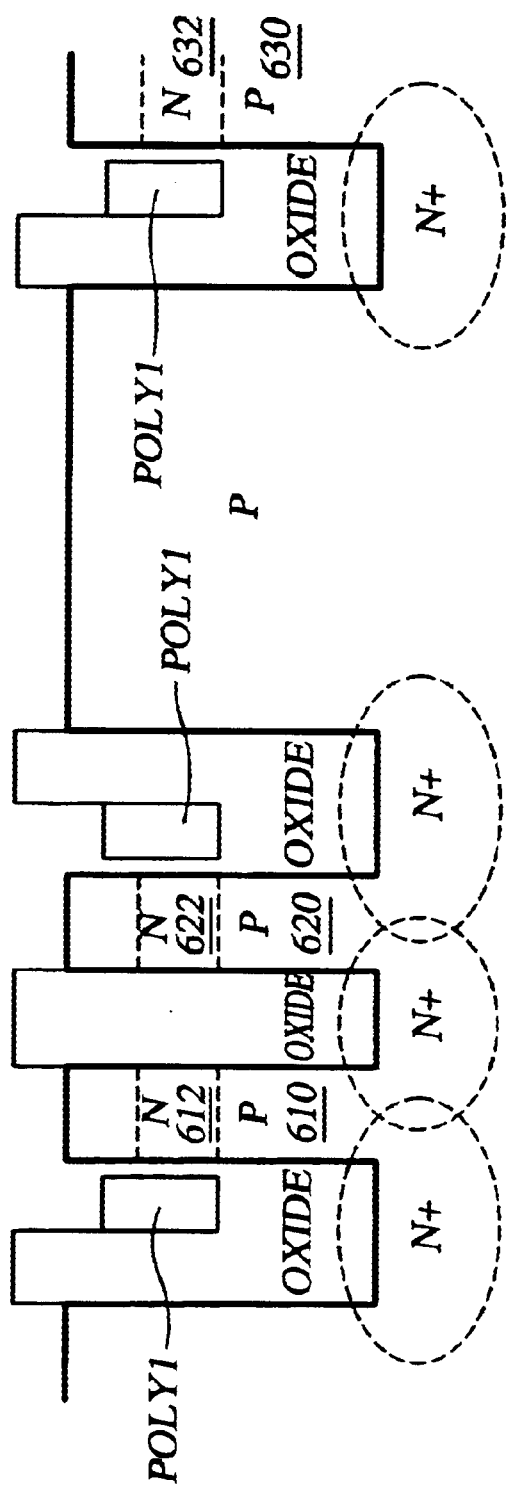
FIG. 6 shows another step in the formation of the thyristor-based semiconductor device shown in FIG. 5, according to another example embodiment of the present invention.
Figure 7:
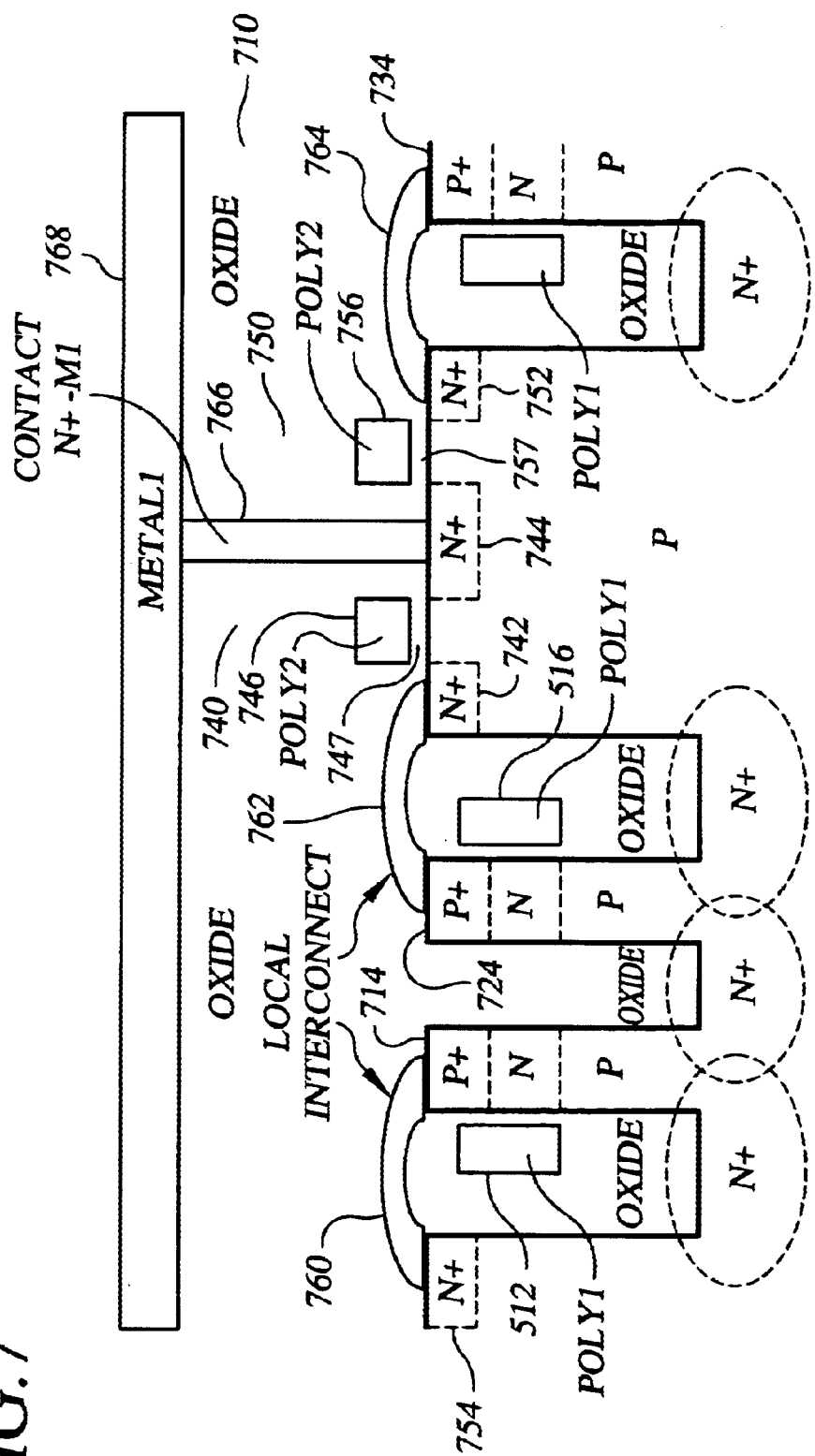
FIG. 7 shows another step in the formation of the thyristor-based semiconductor device shown in FIG. 6, according to another example embodiment of the present invention.

The nitride mask is then removed in FIG. 6, and P base thyristor portions 610, 620 and 630, along with N base thyristor portions 612, 622 and 632 are formed using, for example, conventional dopant implantation methods described herein. The P base portions are each electrically connected with their corresponding N base and N+ emitter regions, and the N base portions are also electrically connected to their corresponding P+ emitter regions. P+ emitter regions 714, 724 and 734 are formed over the P base portions in FIG. 7. Transistors 740 and 750 are then formed by first depositing a gate oxide 747 and 757, and forming a polysilicon over the gate oxide. The polysilicon is then photolithographically masked and etched to form gate portions 746 and 756, and the source/drain regions 742, 744 and 752 are implanted (N+ source/drain region 754 is also implanted and shown without remaining transistor portions). In a more particular implementation, gate portions 746 and 756 are formed in a single deposition step with the formation of gates 512 and 516. Alternatively, the formation of the source/drain regions may include a lightly-doped drain (LDD) implant following the gate photo-etch, and subsequent formation of sidewall spacers on the gate. Once the sidewall spacers are in place, a second source/drain implant is effected to form heavily-doped portions adjacent the LDD portions. Local interconnects 760, 762 and 764 are then formed electrically coupling the P+ emitter portions of the thyristors and the N+ source/drain regions of the transistors. Contact 766 is formed in an oxide 710, and a metal interconnect 768 is formed over the oxide and can be used to couple the circuitry to a variety of other circuitry.

Figure 8:
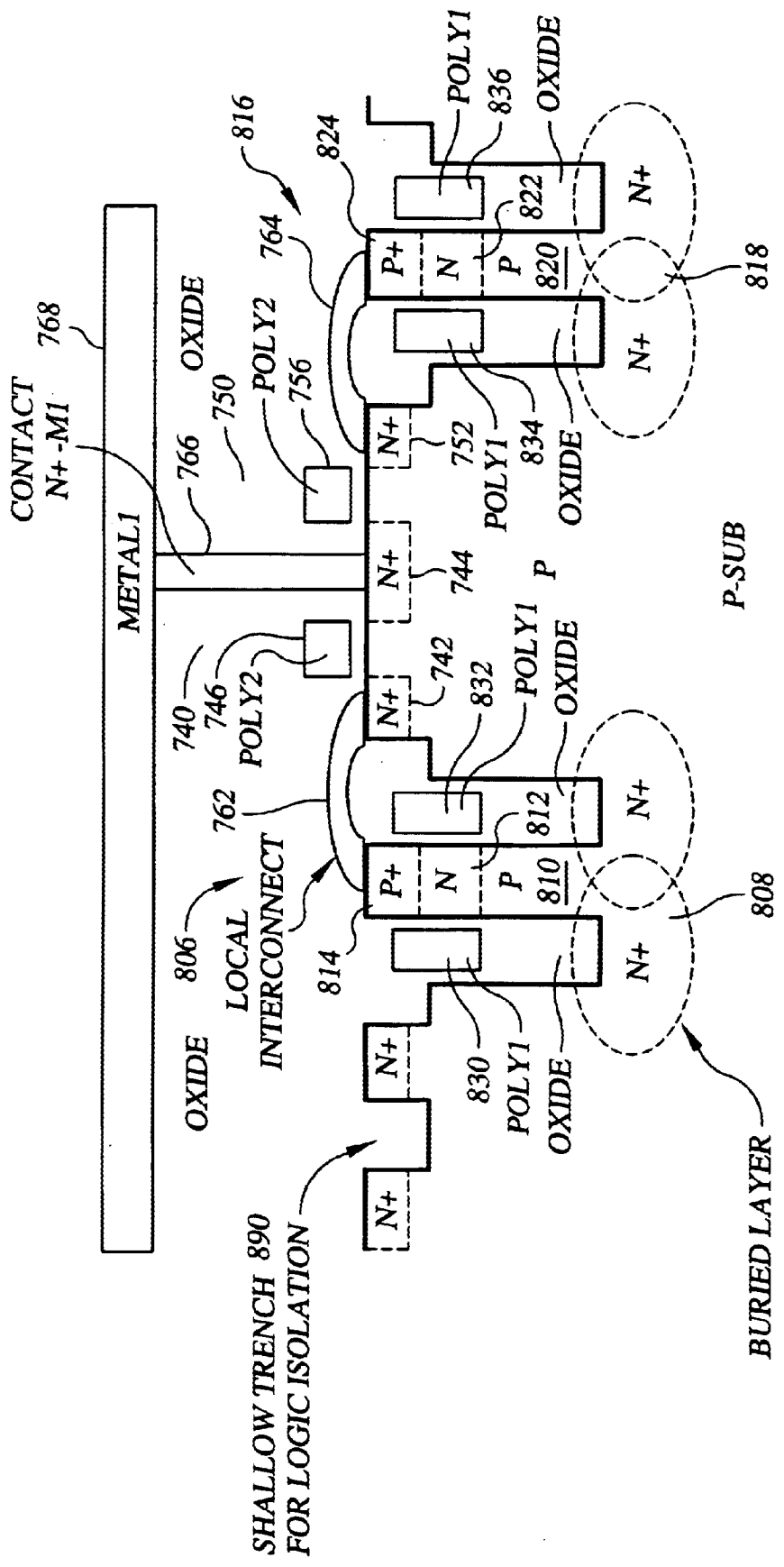
FIG. 8 is a thyristor-based semiconductor device, according to another example embodiment of the present invention.

FIG. 8 shows a thyristor-based semiconductor device having a split gate, according to another example embodiment of the present invention. The device is similar to the device shown in FIG. 7, with a difference including the use of gates on both sides of the thyristor. In this instance, thyristors 806 and 816 are formed having N+ emitter regions 808 and 818, P base regions 810 and 820, N base regions 812 and 822, and P+ regions 814 and 824. Gate portions 830 and 832 are formed in oxide trenches and adjacent thyristor 806, and gates 834 and 836 are formed similarly adjacent thyristor 816. In one implementation, the gates 834 and 836 are part of a contiguous gate region that surrounds the thyristor. In addition, FIG. 8 shows another alternate implementation wherein a shallow trench isolation (STI) 890 is used to isolate additional circuitry in the device from the thyristor.

Figure 9:
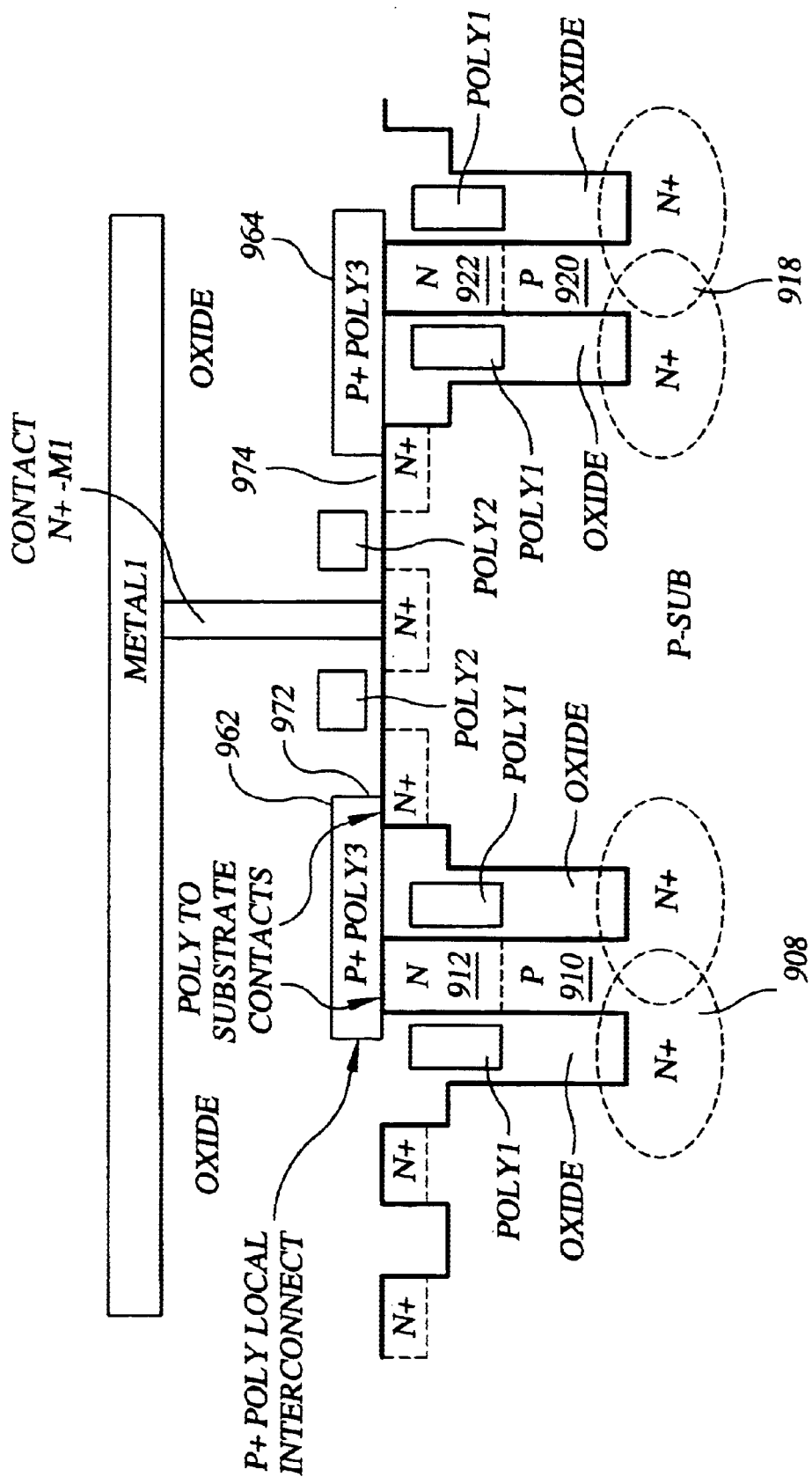
FIG. 9 is a thyristor-based semiconductor device, according to another example embodiment of the present invention.

FIG. 9 shows a thyristor-based semiconductor device having a P+ emitter region that acts as a portion of an interconnect to a transistor, according to another example embodiment of the present invention. The thyristor device is formed having N+ emitter regions 908 and 918, P base regions 910 and 920 and N base regions 912 and 922, for example, in a similar manner as described hereinabove. P+ emitter regions 962 and 964 are then formed over the N base regions and extending laterally to the N+ source/drain region of a transistor. A high conductivity material, such as salicide 972 and 974, is formed to connect the p+ emitter and n+ source/drain to electrically couple the thyristor to the transistor.

Figure 10A:
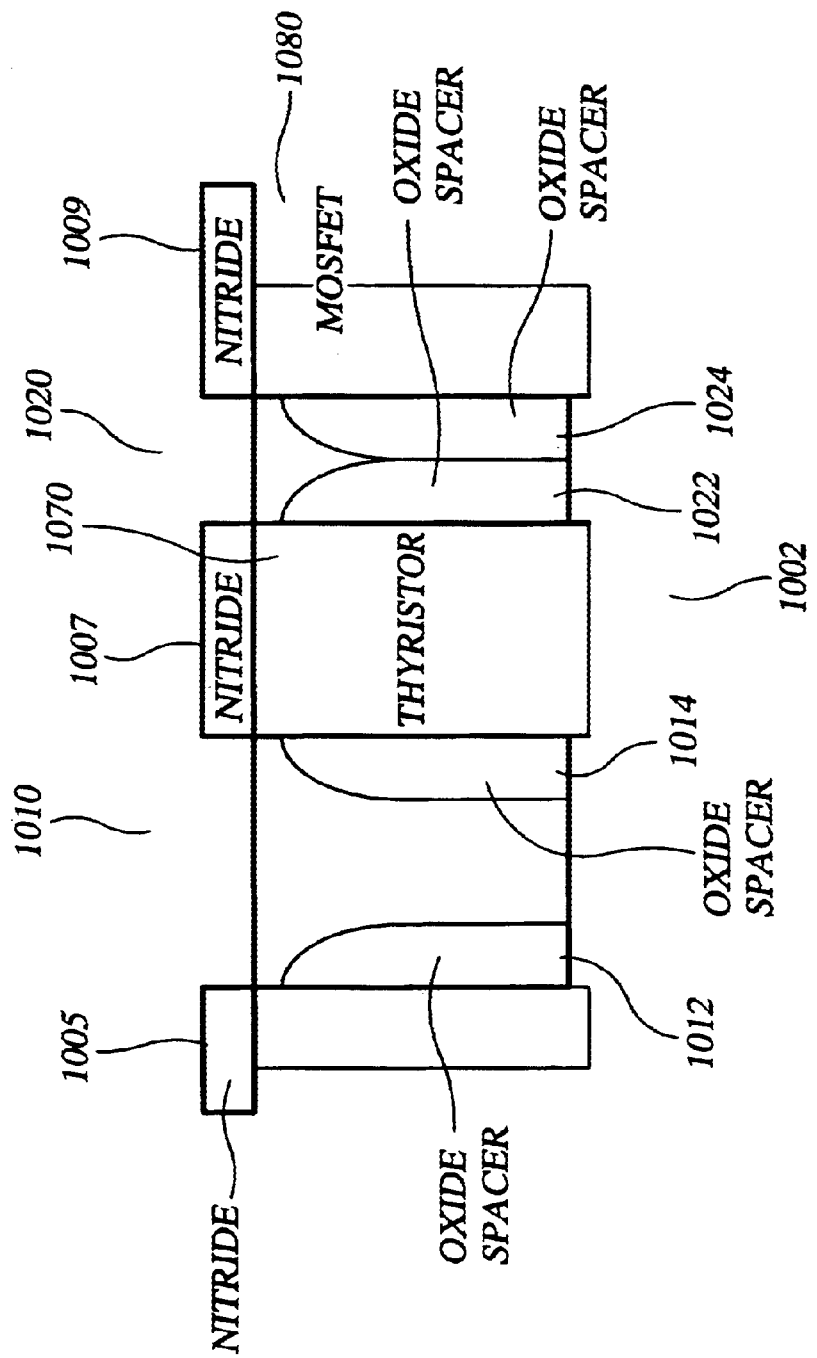
FIG. 10A shows a step in the formation of a thyristor-based semiconductor device, according to another example embodiment of the present invention.
Figure 10B:
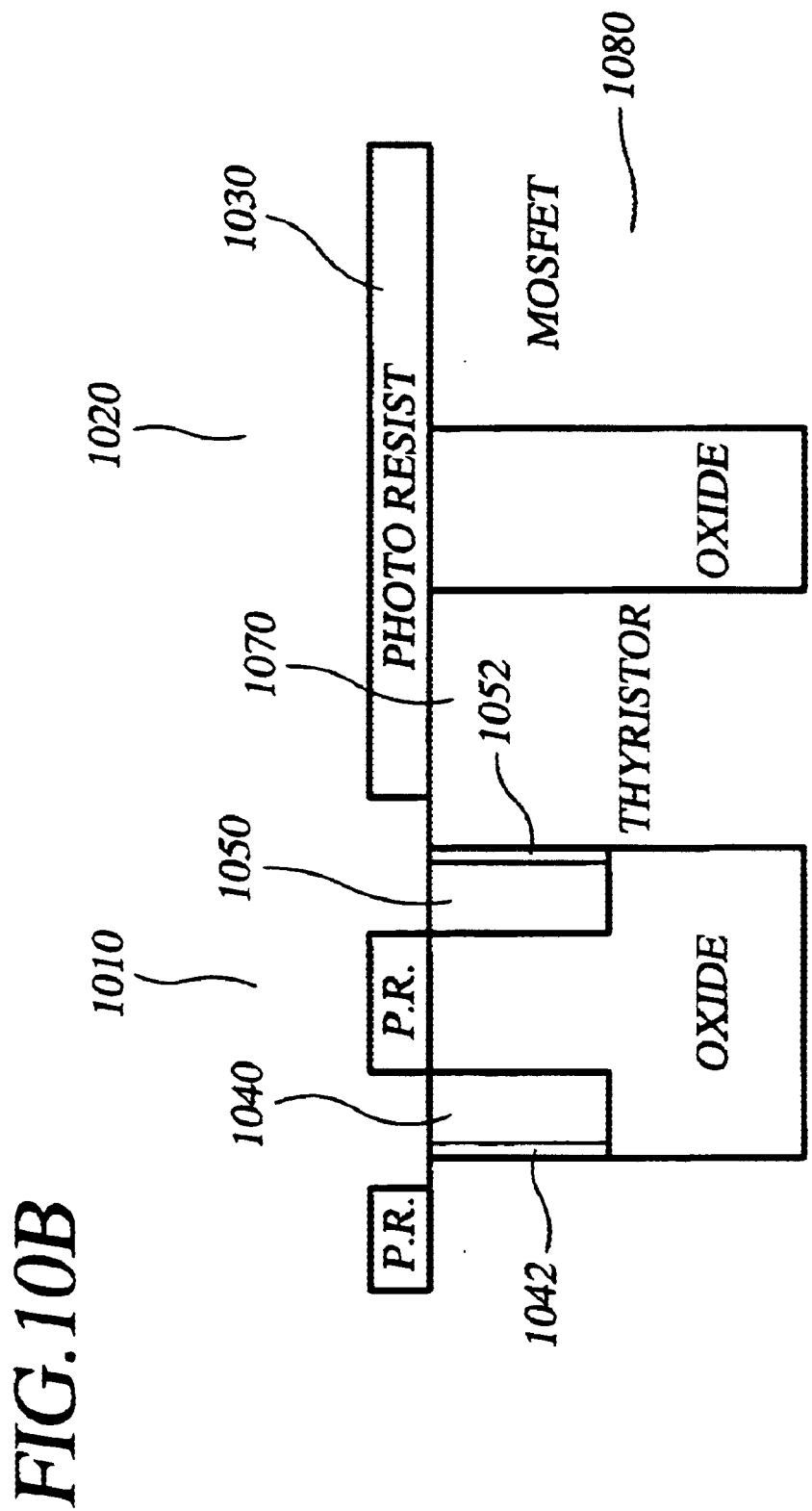
FIG. 10B shows another step in the formation of the thyristor-based semiconductor device shown in FIG. 10A, according to another example embodiment of the present invention.
Figure 10C:
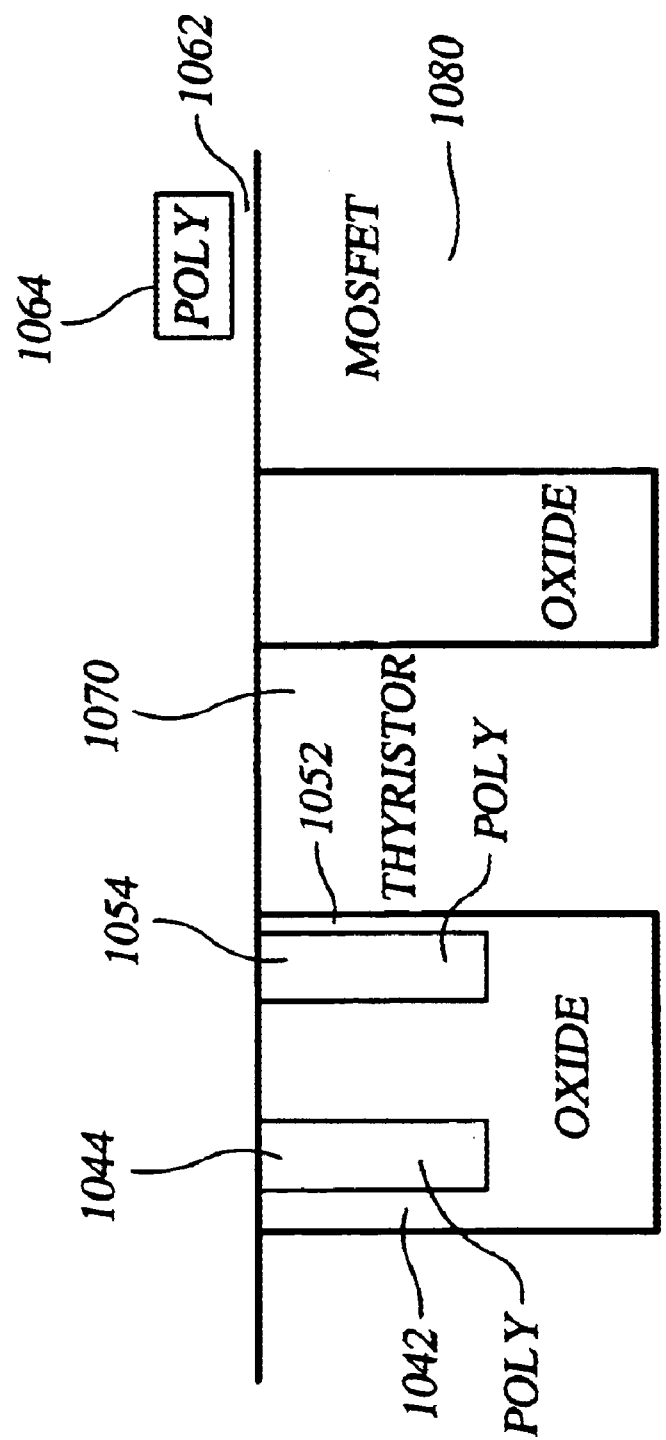
FIG. 10C shows another step in the formation of the thyristor-based semiconductor device shown in FIG. 10B, according to another example embodiment of the present invention.

The formation and filling of the trenches in each of the above and other example implementations can be accomplished in a variety of manners. FIGS. 10A–10C show the formation of gates in a substrate including a MOSFET 1080 and a thyristor 1070 (each shown without implant regions), according to another example embodiment of the present invention. In FIG. 10A, a nitride layer is patterned over a substrate 1002 to form mask regions 1005, 1007 and 1009, and trenches 1010 and 1020 are etched in the substrate.

Oxide material is deposited and anisotropically etched to form spacers 1012, 1014, 1022 and 1024, forming sidewall spacers in trench 1010 and filling trench 1020. The bottom of the thyristor is then implanted with a dopant to form an emitter region, and the implant is optionally driven into the substrate via a subsequent process, such as annealing. The unfilled portion of the trenches is then filled with oxide, which may be planarized by using chemical-mechanical polishing (CMP) or another planarization method, and the nitride is removed. Other implants are then effected, such as for source/drain or well regions of the MOSFET 1080, base or emitter portions of the thyristor 1070, or for other circuitry.

A photoresist 1030 is patterned over the device in FIG. 10B and the oxide is etched to form openings 1040 and 1050. Gate oxide 1042 and 1052 is then formed in the openings, and polysilicon gates 1044 and 1054 are formed adjacent the gate oxide in FIG. 10C. In one particular implementation, gate oxide 1062 and gate 1064 for the MOSFET 1080 are formed with gate oxide 1042 and 1052, and with gates 1044 and 1054, respectively.

Figure 11A:
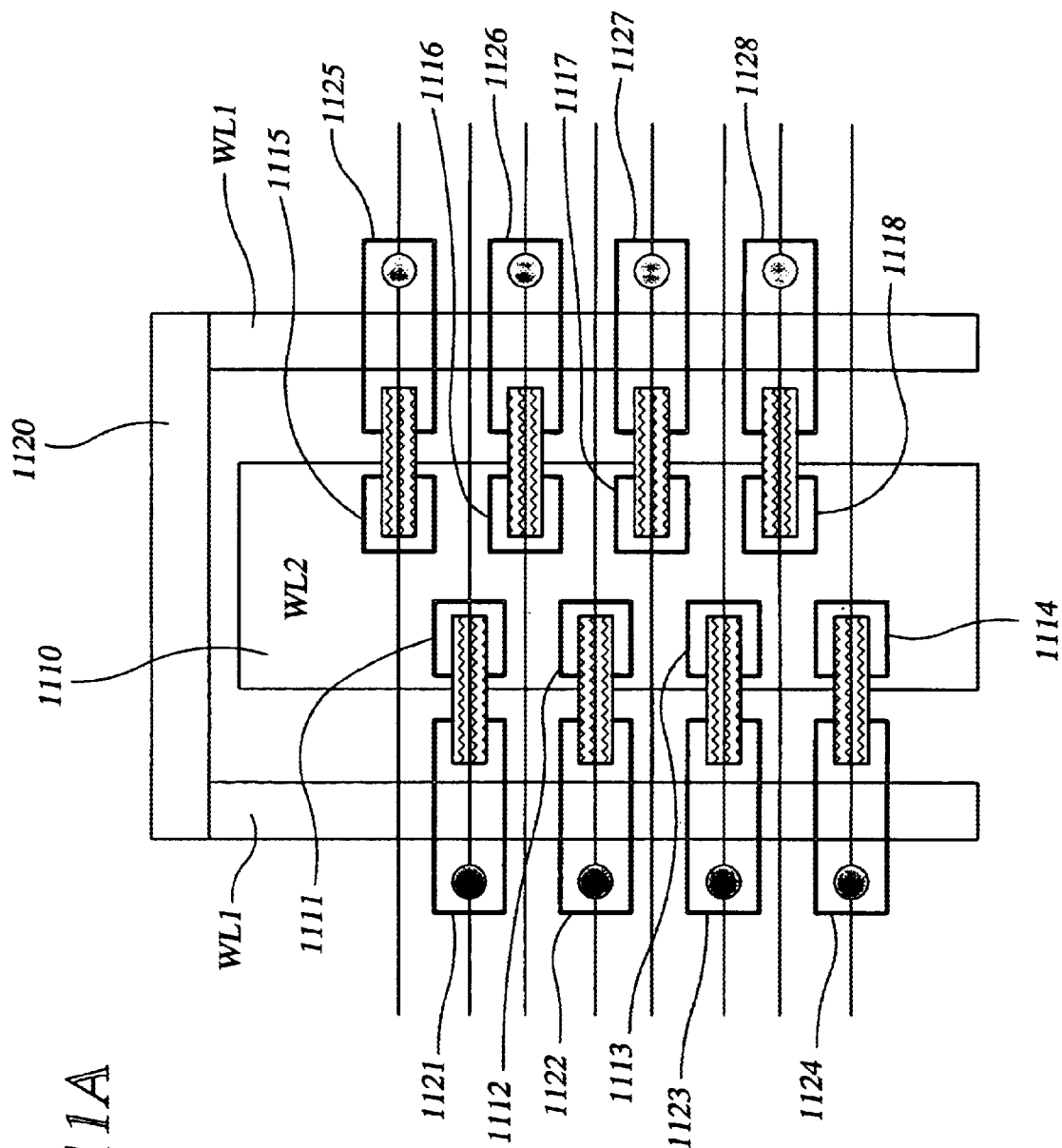
FIG. 11A is a memory array having a split word line, according to an example embodiment of the present invention.

FIG. 11A shows an array of memory cells having a split (or folded) word line and including thyristor-based memory devices coupled to a transistor, according to another example embodiment of the present invention. Split word line 1120 is capacitively connected to a gate portion of CMOS transistors 1121, 1122, 1123, 1124, 1125, 1126, 1127 and 1128. A source/drain portion of each of the transistors is electrically connected via local interconnect to either an anode or cathode portion of eight thyristors 1111, 1112, 1113, 1114, 1115, 1116, 1117 and 1118, and each thyristor is electrically connected to a second word line 1110. The second word line is electrically connected to a base portion of either an anode or cathode portion that is not coupled to the local interconnect. Each thyristor is formed adjacent a trench that is adapted to isolate the thyristor from other circuitry in the device. In one particular implementation, the memory cells include cells formed as shown in FIG. 8, with the word line 1120 being represented by gate portion 746, and word line 1110 being represented by gate portions 830 and 832.

Figure 11B:
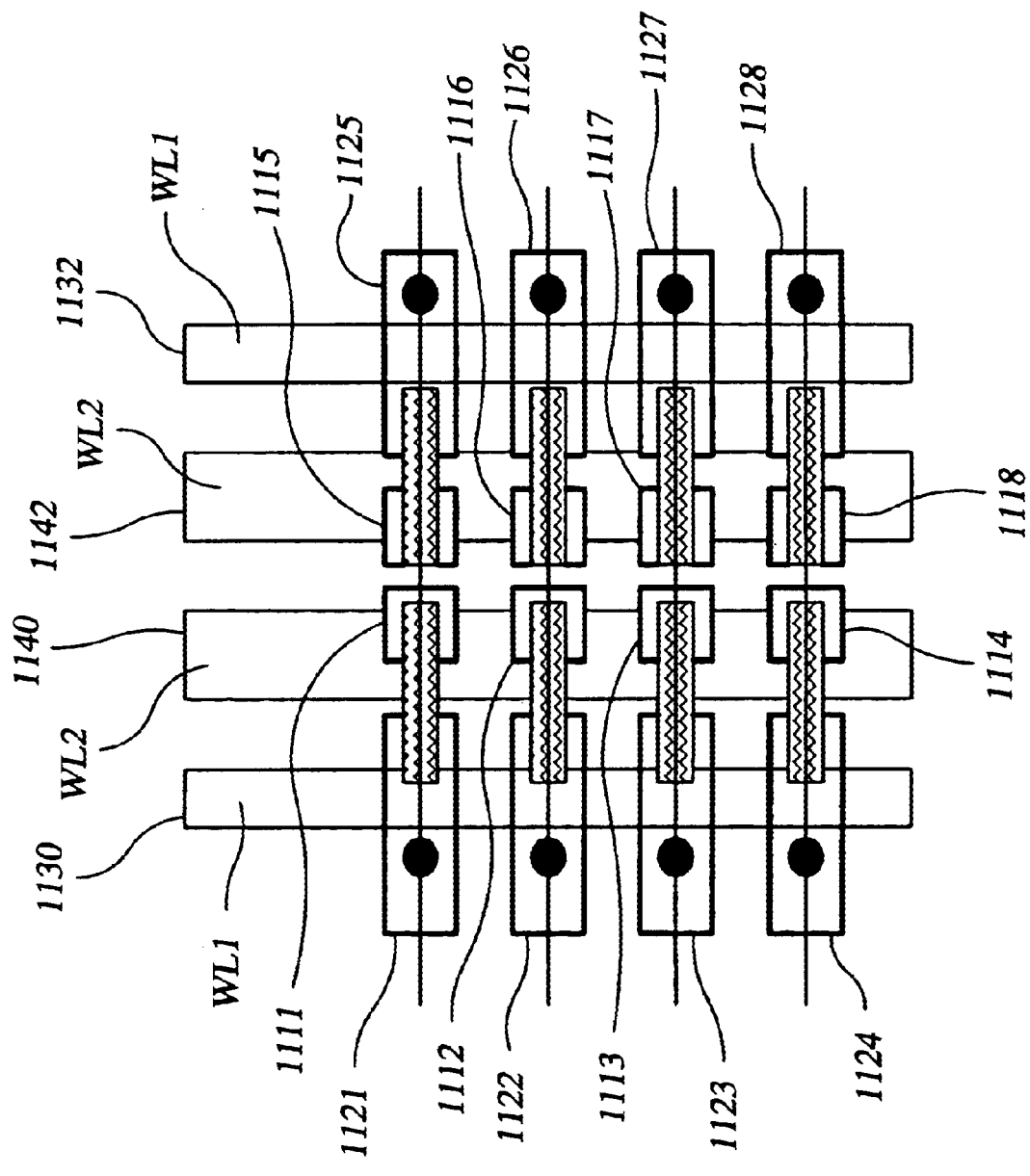
FIG. 11B is a memory array having a separate word line, according to another example embodiment of the present invention.

FIG. 11B shows another array of memory cells having separate word lines 1130 and 1132 and including thyristor-based semiconductor devices, according to another example embodiment of the present invention. Word line 1130 is electrically connected to a gate portion of CMOS transistors 1121, 1122, 1123 and 1124, and word line 1132 is electrically connected to a gate portion of CMOS transistors 1125, 1126, 1127 and 1128. A source/drain region of each of the transistors is electrically connected via local interconnect to a thyristor. Either an anode or cathode end portion of each of thyristors 1111, 1112, 1113 and 1114 is electrically connected to word line 1140, and an anode or cathode end portion of each of thyristors 1115, 1116, 1117 and 1118 is electrically connected to word line 1142. Each thyristor is formed adjacent a trench that is adapted to isolate the thyristor from other circuitry in the device. In one particular implementation, the memory cells include cells formed as shown in FIGS. 3–7, with one of the word lines 1130 and 1132 being represented by gate portion 746, and word lines 1140 and 1142 being represented by gate portions 512 and 516.

Figure 12:
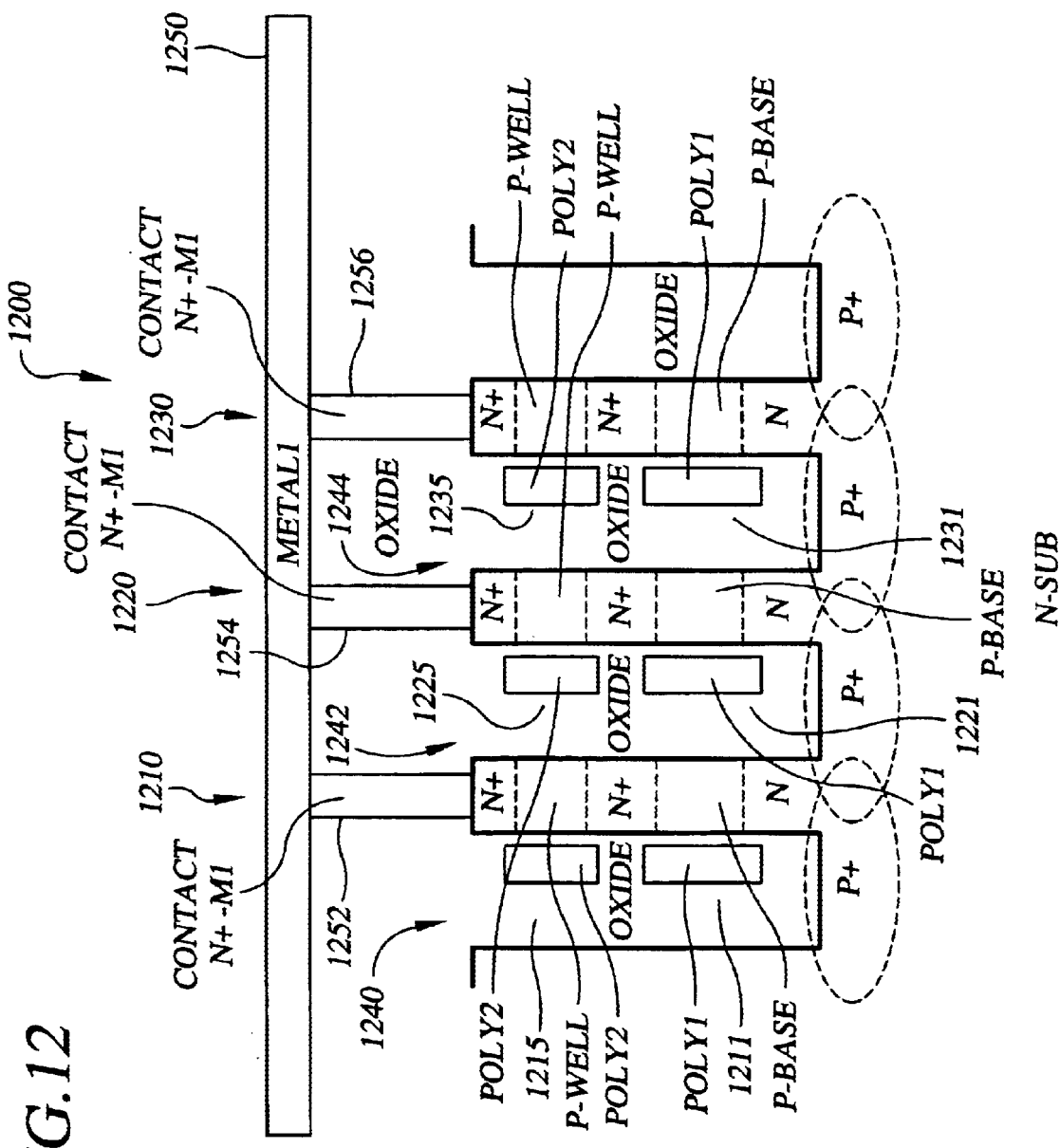
FIG. 12 is a semiconductor device having a pass gate formed coupled to a thyristor and vertically aligned with the thyristor, according to another example embodiment of the present invention.

FIG. 12 shows a semiconductor device 1200 having pass gates formed coupled to and vertically aligned with a thyristor, according to another example embodiment of the present invention. Thyristors 1211, 1221 and 1231 are formed having contiguous vertically adjacent base and emitter regions, such as those described hereinabove. Pass gates 1215, 1225 and 1235 are formed over the thyristors and vertically aligned therewith. Each of the vertically aligned thyristor and pass gate combinations 1210, 1220 and 1230 are electrically isolated by trenches 1240, 1242 and 1244, and are connected to an interconnect 1250 via contacts 1252, 1254 and 1256.

Figure 13:
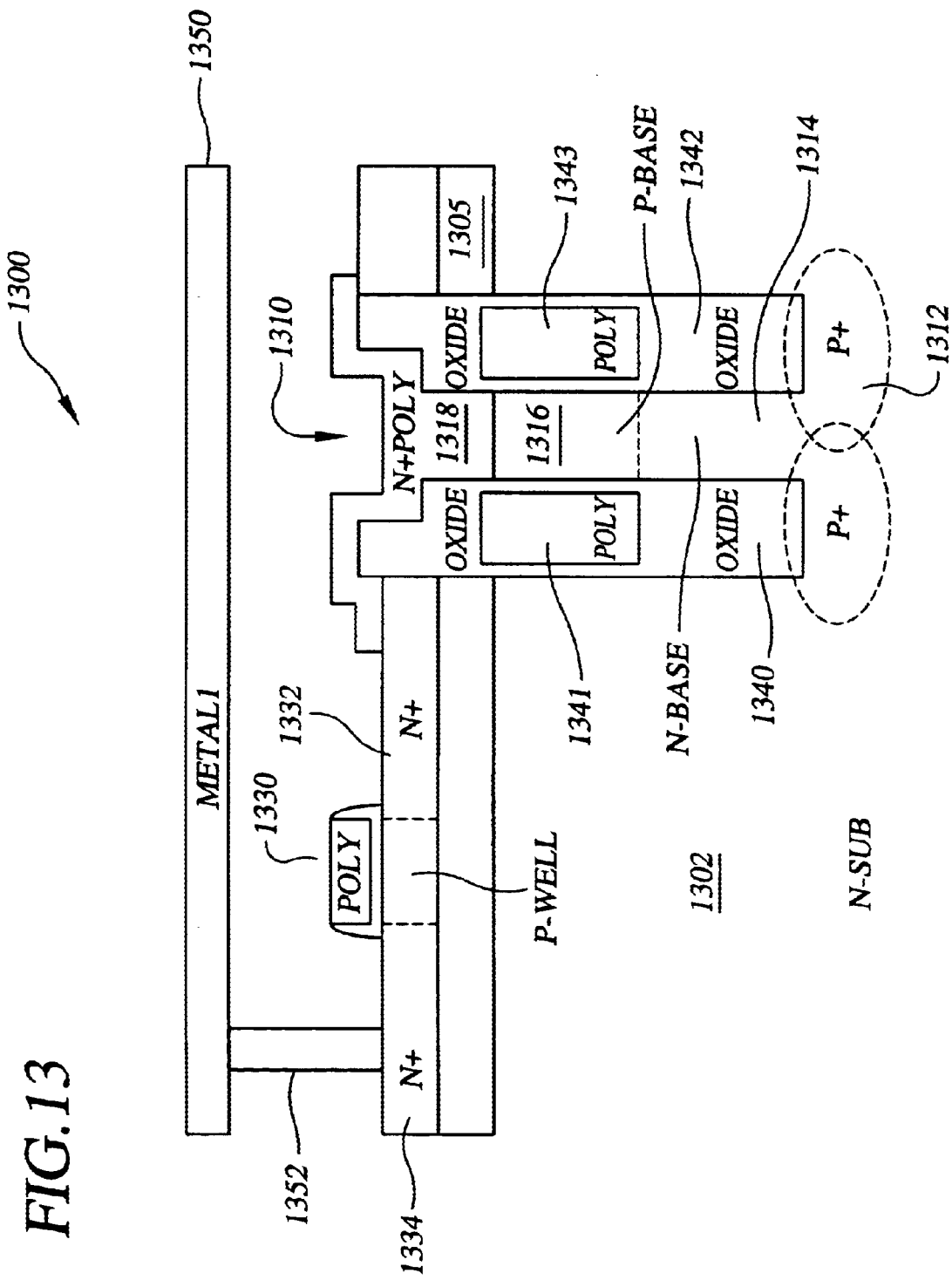
FIG. 13 is a semiconductor device having a pass gate formed coupled to a thyristor and vertically aligned with the thyristor, according to another example embodiment of the present invention.

FIG. 13 is a semiconductor device 1300 having silicon on insulator (SOI) structure with a buried insulator 1305 and a thyristor 1310 electrically isolated using trenches 1340 and 1342, according to another example embodiment of the present invention. The thyristor includes vertically adjacent regions that include a P+ emitter region 1312, N-base 1314, P-base 1316 and N+ emitter 1318. Control ports 1341 and 1343 are capacitively coupled to the P-base region 1316. The thyristor is coupled to a pass gate 1330 via a portion of the N+ emitter region 1318 that extends to an N+ source/drain region 1332 of the pass gate 1330. Another source/drain region 1334 is coupled via a contact 1352 to a metal interconnect 1350 that can be coupled to other circuitry.

Another aspect of the present invention is directed to improving the stability of the above-described thyristor devices in the presence of high temperatures and various disturbances. In this context, the above-described thyristor devices are modified and/or enhanced as described in concurrently-filed U.S. patent application Ser. No. 09/814,980, entitled "Stability In Thyristor-Based Memory Device," now U.S. Pat. No. 6,462,359 issued Oct. 8, 2002 (No. TRAM.002PA), incorporated herein by reference in its entirety. The skilled artisan will appreciate that a shunt element, such a,s described in the concurrently-filed patent document, can be formed in the trench below the control port (e.g., 140 of FIG. 1) and using similar manufacturing techniques used in forming the control port. In another embodiment, the shunt element can be formed in a second trench on the side of the vertically-adjacent thyristor regions (e.g., 134, 136 of FIG. 1) opposite the side adjacent the control port.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors; adding structures to the integrated circuit device; increasing the number of PN sections in the current-switching device; interchanging P and N regions in the device structures and/or using PMOSFETS rather than NMOSFETS; changing the thyristors from anode up to cathode up configuration; forming the bottom node (anode or cathode) with buried layers (which may or may not involve epitaxial semiconductor growth); and using poly emitters for either anode or cathode and/or local interconnect (e.g. combining local interconnect with part of the thyristor). Such modifications and changes do not depart from the true spirit and scope of the present invention that is set forth in the following claims.

What is claimed is:

1. A semiconductor device including a substrate and a thyristor having thyristor regions adapted to pass current in response to control signals, the semiconductor device comprising:

a doped substrate region including at least two vertically-adjacent thyristor regions of different polarity;

a trench in the substrate adjacent the duped substrate region;

a thyristor control port capacitively coupled to at least one of the thyristor regions for switching the thyristor between stable conductance states independent of any MOS inversion formation in said at least one of the thyristor regions; and in the trench, a dielectric material configured and arranged to electrically insulate the vertically-adjacent thyristor regions.

2. The semiconductor device of claim 1, wherein the control port is located in the trench and is capacitively coupled to at least one of the vertically-adjacent regions.

3. The semiconductor device of claim 1, wherein the control port is located in the trench along with the dielectric material.

4. A semiconductor device, comprising: an array of memory cells, wherein each memory cell includes a thyristor as characterized by claim 1.

5. The semiconductor device of claim 1, further comprising conductive material that is adapted to interconnect the thyristor to other circuitry in the semiconductor device.

6. The semiconductor device of claim 1, further including an implanted region of the substrate over doped substrate and adapted as an emitter of the thyristor.

7. The semiconductor device of claim 1, further comprising:

a second trench in the substrate; and a control port in the second trench and capacitively coupled to a region of the thyristor.

8. The semiconductor device of claim 1, wherein the control port faces a part of at least two of the thyristor regions.

9. The semiconductor device of claim 1, wherein three of the thyristor regions are below an upper portion of the trench.

10. The semiconductor device of claim 1, wherein the control port is adapted as a gate for a thin capacitively coupled thyristor.

11. The semiconductor device of claim 1, further comprising a second trench in the substrate, wherein the doped substrate region includes an implanted region of the substrate that is horizontally between both trenches.

12. The semiconductor device of claim 1, further comprising a doped emitter region in the substrate that is below the bottom of the trench, the doped emitter region arranged as one of the thyristor regions adapted to pass current.

13. The semiconductor device of claim 1, wherein the control port is formed in the trench, and wherein the trench further includes an insulative material adapted to electrically isolate the control port from a portion of the thyristor.

14. The semiconductor device of claim 1, further comprising a second trench in the substrate adapted to electrically isolate another circuit portion in the device from the thyristor and control port.

15. The semiconductor device of claim 1, further comprising a doped anode region in the substrate that is below the bottom of the trench, the doped anode region arranged as one of the thyristor regions adapted to pass current.

16. The semiconductor device of claim 2, wherein the control port includes a side wall spacer on a side wall of the trench and wherein a portion of the spacer is adapted to act as the control port.

17. The semiconductor device of claim 4, wherein the array includes bit and word lines shared by selected ones of the memory cells.

18. The semiconductor device of claim 9, wherein at least two of the three thyristor regions include a portion of the substrate.

19. A semiconductor device including a substrata and a thyristor having thyristor regions adapted to pass current in response to control signals, the semiconductor device comprising:

a doped substrate region including at least two vertically-adjacent thyristor regions of different polarity;

a trench in the substrate adjacent the doped substrate region and having a width along a plane orthogonal to the vertical plane;

a thyristor control port capacitively coupled to at least one of the thyristor regions and filling a majority of the width; and in the trench, a dielectric material configured and arranged to electrically insulate the vertically-adjacent thyristor regions.

20. A semiconductor device including a substrate and a thyristor having thyristor regions adapted to pass current in response to control signals, the semiconductor device, the device comprising:

a doped substrate region including at least two vertically-adjacent thyristor regions of different polarity;

a trench in the substrate adjacent the doped substrate region;

in the trench,
a dielectric material configured and arranged to electrically insulate the vertically-adjacent thyristor regions,
a thyristor control port capacitively coupled to at least one of the thyristor regions, and
a control-port dielectric between the thyristor control port and said at least one of the thyristor regions.

21. A semiconductor device including a substrate and a thyristor having thyristor regions adapted to pass current in response to control signals, the semiconductor device comprising:

a doped substrate region including at least two vertically-adjacent thyristor regions of different polarity;

a trench in the substrate adjacent the doped substrate region;

a thyristor control port capacitively coupled to at least one of the thyristor regions;

in the trench, a dielectric material configured and arranged to electrically insulate the vertically-adjacent thyristor regions; and a doped polysilicon local interconnect adapted as at least one of: an emitter of the thyristor, and an electrical interconnect to a pass gate.

22. A semiconductor device including a substrate and a thyristor having thyristor regions adapted to pass current in response to control signals, the semiconductor device comprising:

a doped substrate region including at least two vertically-adjacent thyristor regions of different polarity, and including a transistor structure vertically-adjacent the thyristor, the transistor structure including one of the vertically-adjacent thyristor regions, a well region and a region having the same polarity as the one of the vertically-adjacent thyristor regions; and a gate adjacent the well region and adapted to electrically activate the transistor;

a trench in the substrate adjacent the doped substrate region;

a thyristor control port capacitively coupled to at least one of the thyristor regions; and in the trench, a dielectric material configured and arranged to electrically insulate the vertically-adjacent thyristor regions.

23. A semiconductor device including a substrate having a buried insulator layer as part of a SOI structure and a thyristor having thyristor regions adapted to pass current in response to control signals, the semiconductor device comprising:
- a doped substrate region including at least two vertically-adjacent thyristor regions of different polarity and extending through the buried insulator layer;
- a trench in the substrate adjacent the doped substrate region;
- a thyristor control port capacitively coupled to at least one of the thyristor regions; and
- in the trench, a dielectric material configured and gauged to electrically insulate the vertically-adjacent thyristor regions.

24. A semiconductor device including a substrate and a thyristor having thyristor regions adapted to pass current in response to control signals, the semiconductor device characterized by:
- a trench in the substrate adjacent a doped substrate region including at least two vertically-adjacent thyristor regions of different polarity;
- a thyristor control means, capacitively coupled to at least one of the thyristor regions and responsive to the control signals, for causing the thyristor to switch between current-passing and current-blocking modes; and
- in the trench, means for electrically insulating the vertically-adjacent thyristor regions.

25. A semiconductor device including a substrate and a thyristor having thyristor regions adapted to pass current in response to control signals the semiconductor device characterized by:
- a trench in the substrate adjacent a doped substrate region;
- a doped substrate region including at least two vertically-adjacent thyristor regions of different polarity;
- a thyristor control means, capacitively coupled to at least one of the thyristor regions and responsive to the control signals, for causing the thyristor to switch between current-passing and current-blocking modes;
- in the trench, means for electrically insulating the vertically-adjacent thyristor regions; and
- a shunt region coupled to conduct current to at least one of the thyristor regions.

26. A semiconductor device including a substrate and a TCCT having regions of opposite polarity, the semiconductor device characterized by:
- a trench in the substrate adjacent a doped substrate region and adapted to electrically isolate the doped substrate region;
- a the doped substrate region including at least two vertically-adjacent TCCT regions of different polarity, one of the TCCT regions being a base region;
- an insulating material on a wall of the trench adjacent the TCCT device; and
- a control port in the trench and capacitively coupled to the base region via the insulating material, the insulating material and control port being adapted to effect a capacitance between the control port and the base region that is greater than capacitance between any other portion of the thyristor and the base region.

27. A semiconductor device, comprising:
- an array of memory cells formed adjacent a substrate;
- a circuit including word and bit lines for connecting memory-control signals, including control and data signals, with certain memory cells in the array, each of a plurality of the memory cells in the array including:
  - a thyristor having thyristor regions adapted to pass current in response to the memory-control signals;
  - a doped substrate region including vertically-adjacent thyristor regions of different polarity which form a part of the thyristor;
  - a trench in the substrate adjacent the doped substrate region;
  - a thyristor control port that is adapted for capacitively coupling to at least one of the thyristor regions for switching the thyristor between stable conductance states independent of any MOS inversion formation in said at least one of the thyristor regions; and
  - in the trench, a dielectric material configured and arranged to electrically insulate the vertically-adjacent thyristor regions.

28. The semiconductor device of claim 27, wherein the word and bit lines are shared by said certain memory cells in the array.

29. The semiconductor device of claim 27, further comprising a doped anode region in the substrate that is below the bottom of the trench, the doped anode region arranged as one of the thyristor regions adapted to pass current in response to the memory-control signals.

30. The semiconductor device of claim 27, further comprising a doped cathode region in the substrate that is below the bottom of the trench, the doped cathode region arranged as one of the thyristor regions adapted to pass current in response to the memory-control signals.

31. A semiconductor device including a substrate, the semiconductor device comprising:
- an output port;
- a thyristor having a thyristor body with at least two vertically-adjacent thyristor regions and an end region, the thyristor being adapted to respond to control signals by passing current through each of the thyristor body regions and from die end region to the output port;
- a doped substrate region including the at least two vertically-adjacent thyristor regions of different polarity;
- a trench in the substrate adjacent the doped substrate region and, in the trench, a dielectric material configured and arranged to electrically insulate the vertically-adjacent thyristor regions; and
- a thyristor control port capacitively coupled to said at least two vertically-adjacent thyristor regions for switching the thyristor between stable conductance states.

32. The semiconductor device of claim 31, wherein the thyristor body further includes another end region that is biased at a fixed voltage level.

33. The semiconductor device of claim 31, wherein the end region is a cathode region and wherein the thyristor body includes an anode region below the trench.

34. A semiconductor device including a substrate, the semiconductor device comprising:
- a thyristor having a thyristor body with at least two vertically-adjacent thyristor regions and an end region, the thyristor being adapted to respond to control signals by passing current through each of the thyristor body regions and from the end region;

a doped substrate region including the at least two vertically-adjacent thyristor regions of different polarity;

a trench in the substrate, adjacent the doped substrate region and, in the trench, a dielectric material configured and arranged to electrically insulate the vertically-adjacent thyristor regions; and a thyristor control port capacitively coupled to said at least two vertically-adjacent thyristor regions for switching the thyristor between stable conductance states, wherein the thyristor control port is the only control port capacitively coupled to the thyristor body for switching the thyristor between stable conductance states.

35. A semiconductor device having a thyristor cell that switches between stable conductance states in response to control signals respectively carried by control lines, the semiconductor device comprising:

a thyristor having a thyristor body with at least two vertically-adjacent thyristor regions and with an end region;

a pass device having a control node coupled to one of the control lines, and being adapted to pass current at the end region in response to one of the control signals at said one of the control lines;

a doped region of a substrate including said at least two vertically-adjacent thyristor regions of different polarity;

a trench in the substrate adjacent the doped substrate region and, in the trench, a dielectric material configured and arranged to electrically insulate the vertically-adjacent thyristor regions; and a thyristor control port responsive to another one of the control signals and capacitively coupled to at least one of the thyristor regions, the thyristor being adapted to respond to at least one of the control signals.

36. The semiconductor device of claim 35, wherein the end region is a cathode region and wherein the thyristor body includes an anode region below the trench.

37. The semiconductor device of claim 25, wherein the thyristor body includes an emitter region below the trench.

38. The semiconductor device of claim 35, wherein the pass device includes an insulated-gate, field-effect transistor (FET) and the control node is a gate for the FET.

39. The semiconductor device of claim 35, wherein the pass device includes a insulated-gate, field-effect transistor (FET) and the control node is a gate for the FET, and wherein the gate and the control port are capacitively coupled to respective regions having a common polarity.

40. A semiconductor device having a thyristor cell that switches between stable conductance states in response to control signals respectively carried by control lines, the semiconductor device comprising:

a thyristor having a thyristor body with at least two vertically-adjacent thyristor regions;

a pass device having a control node coupled to one of the control lines and having pass regions vertically adjacent to said at least two vertically-adjacent thyristor regions;

a doped region of a substrate including said at least two vertically-adjacent thyristor regions of different polarity;

a trench in the substrate adjacent the doped substrate region and, in the trench, a dielectric material configured and arranged to electrically insulate the vertically-adjacent thyristor regions; and a thyristor control port responsive to another one of the control signals and capacitively coupled to at least one of the thyristor regions, the thyristor being adapted to respond to at least one of the control signals.

41. The semiconductor device of claim 40, wherein the pass device includes a insulated-gate, field-effect transistor (FET) and the control node is a gate for the FET.

42. The semiconductor device of claim 40, wherein the pass device includes a insulated-gate field-effect transistor (RET) and the control node is a gate for the FET, and wherein at least one of the gate and the control port are in the trench.

43. The semiconductor device of claim 40, wherein the pass device includes a insulated-gate field-effect transistor (FET) and the control node is a gate for the FET, and wherein the gate and the control port are in the trench.

44. The semiconductor device of claim 40, further including a contact vertically-oriented over and connected to one of the pass regions, and wherein the pass device includes a insulated-gate field-effect transistor (FET) and the control node is a gate for the FET, and the gate and the control port are in the trench.

45. The semiconductor device of claim 44, wherein the thyristor body includes an emitter region below the trench.

46. A semiconductor device including a substrate and a thyristor having thyristor regions adapted to pass current in response to control signals, the semiconductor device comprising:

a doped substrate region including at least two vertically-adjacent thyristor regions of different polarity;

a trench in and defined by the substrate and adjacent the doped substrate region;

a thyristor control port capacitively coupled to at least one of the thyristor regions for switching the thyristor between stable conductance states independent of any MOS inversion formation in said at least one of the thyristor regions; and in the trench, a dielectric material configured and arranged to electrically insulate the vertically-adjacent thyristor regions.

\* \* \* \* \*

UNITED STATES PATENT AND TRADEMARK OFFICE
CERTIFICATE OF CORRECTION

PATENT NO. : 6,727,528 B1
APPLICATION NO. : 09/815213
DATED : April 27, 2004
INVENTOR(S) : Robins et al.

It is certified that error appears in the above-identified patent and that said Letters Patent is hereby corrected as shown below:

Page 2: Under item (56), Other Publications

"Jun. 1998, Nemati,Farid, and Plummer, James D., "A Novel High Density, Low Voltage SRAM Cell with a Vertical NDR Device", VLSI Technology Technical Digest." should read -- Nemati, Farid, and Plummer, James D., "A Novel High Density, Low Voltage SRAM Cell with a Vertical NDR Device", VLSI Technology Technical Digest, Jun. 1998. --

"1999, Nemati, Farid, and Plummer James, D., "A Novel Thyristor-based SRAM Cell (T-RAM) for High Speed, Low-Voltage, Giga-scale Memories", International Electron Device Meeting Technical Digest." should read -- Nemati, Farid, and Plummer James D., "A Novel Thyristor-based SRAM Cell (T-RAM) for High Speed, Low-Voltage, Giga-scale Memories", International Electron Device Meeting Technical Digest, 1999. --

"Jun. 1998, F.Nemati and J.D. Plummer. A Novel High Density, Low Voltage SRAM Cell with a Vertical NDR Device, Center for Integrated Systems, Stanford University, Stanford, CA 94305." should read -- F.Nemati and J.D. Plummer. A Novel High Density, Low Voltage SRAM Cell with a Vertical NDR Device, Center for Integrated Systems, Stanford University, Stanford, CA 94305, Jun. 1998. --

"F.Nematl and J.D. Plummer, A Novel Vertical Storage SRAM Cell, Student Paper written for Center for Integrated Systems, Stanford University, Stanford, CA 94305." should read -- F.Nemati and J.D. Plummer, A Novel Vertical Storage SRAM Cell, Student Paper written for Center for Integrated Systems, Stanford University, Stanford, CA 94305, \_\_\_\_\_. --

UNITED STATES PATENT AND TRADEMARK OFFICE
CERTIFICATE OF CORRECTION

PATENT NO. : 6,727,528 B1
APPLICATION NO. : 09/815213
DATED : April 27, 2004
INVENTOR(S) : Robins et al.

It is certified that error appears in the above-identified patent and that said Letters Patent is hereby corrected as shown below:

"1999, F. Nemati and J.D. Plummer, A Novel Thyristor-based SRAM Cell (T-RAM) for High-Speed, Low-Voltage, Giga-scale Memories, Center for Integrated Systems, Stanford University, Stanford, CA, 1999." should read -- F. Nemati and J.D. Plummer, A Novel Thyristor-based SRAM Cell (T-RAM) for High-Speed, Low-Voltage, Giga-scale Memories, Center for Integrated Systems, Stanford University, Stanford, CA, 1999. --

"1987, Baliga, B.Jayant, Modern Power Devices, pp. 349-350." should read

-- Baliga, B. Jayant, Modern Power Devices, pp. 349-350 1987. --

"Feb. 1980, Plummer, James D. and Scharf, Brad W., Insulated-Gate Planar Thyristors: I-Structure and Basic Operation, pp. 380-386." should read -- Plummer, James D. and Scharf, Brad W., Insulated-Gate Planar Thyristors: I-Structure and Basic Operation, pp. 380-386, Feb. 1980. --

"Aug. 1992, Christopher J. Petti, and James D. Plummer, The Field-Assisted Turn-Off Thyristor: A Regenerative Device with Voltage-Controlled Turn-Off." should read -- Christopher J. Petti, and James D. Plummer, The Field-Assisted Turn-Off Thyristor: A Regenerative Device with Voltage-Controlled Turn-Off, Aug. 1992.--

"1981, S. M. Szg, Physics of Semiconductor Devices Second Edition. John Wiley & Sons, pp. 198-209, 1981." should read -- S. M. Szg, Physics of Semiconductor Devices Second Edition. John Wiley & Sons, pp. 198-209, 1981. --

"1998, Gribnikov, Z.S., Korobov, V.A. and MItin, V.V., "The Tunnel Diode As A Thyristor Emitter", Solid-State Electronics, vol. 42, No. 9, pp. 1761-1763." should read -- Gribnikov, Z.S., Korobov, V.A. and Mitin, V.V., "The Tunnel Diode As A Thyristor Emitter", Solid-State Electronics, vol. 42, No. 9, pp. 1761-1763, 1998. --

UNITED STATES PATENT AND TRADEMARK OFFICE
CERTIFICATE OF CORRECTION

PATENT NO. : 6,727,528 B1
APPLICATION NO. : 09/815213
DATED : April 27, 2004
INVENTOR(S) : Robins et al.

It is certified that error appears in the above-identified patent and that said Letters Patent is hereby corrected as shown below:

In the Specification

Col. 1, line 59: "Thigh" should read --High--.
Col. 1, line 23: "formned" should read --formed--.
Col. 8, line 31: "a,s" should read --as--.

In the Claims

Col. 10, line 1, Claim 19: "substrata" should read --substrate--.
Col. 11, line 17, Claim 23: "gauged" should read --arranged--.
Col. 11, line 57, Claim 26: delete "a".
Col. 13, line 41, Claim 37: "claim 25" should read --claim 35--.
Col. 14, line 23, Claim 42: "(RET)" should read --(FET)--.

Signed and Sealed this

Twenty-seventh Day of May, 2008

JON W. DUDAS
*Director of the United States Patent and Trademark Office*